United States Patent [19]

Lee

[11] Patent Number: 4,862,232
[45] Date of Patent: Aug. 29, 1989

[54] TRANSISTOR STRUCTURE FOR HIGH TEMPERATURE LOGIC CIRCUITS WITH INSULATION AROUND SOURCE AND DRAIN REGIONS

[75] Inventor: Han-Sheng Lee, Troy, Mich.

[73] Assignee: General Motors Corporation, Detroit, Mich.

[21] Appl. No.: 909,565

[22] Filed: Sep. 22, 1986

[51] Int. Cl.$^4$ ............................................. H01L 29/78
[52] U.S. Cl. ..................................... 357/23.1; 357/49; 357/50; 357/42; 357/23.3
[58] Field of Search ..................... 357/23.1, 49, 50, 42, 357/23.3

[56] References Cited

U.S. PATENT DOCUMENTS

| | | | |
|---|---|---|---|
| Re. 31,580 | 5/1984 | Kooi | 357/23 |
| 3,544,858 | 5/1970 | Kooi | 317/235 |
| 3,763,408 | 10/1973 | Kano et al. | 317/235 |
| 3,806,371 | 4/1974 | Barone | 148/1.5 |
| 3,958,040 | 5/1976 | Webb | 427/94 |
| 3,961,358 | 6/1976 | Polinsky | 357/53 |
| 3,965,481 | 6/1976 | Esser | 357/24 |
| 4,065,781 | 12/1977 | Gutknecht | 357/23 |
| 4,091,527 | 5/1978 | Goodman et al. | 29/571 |
| 4,101,922 | 7/1978 | Tihanyi et al. | 357/23 |
| 4,143,388 | 3/1979 | Esaki et al. | 357/23 |
| 4,178,197 | 12/1979 | Marinace | 148/175 |
| 4,241,359 | 12/1980 | Izumi et al. | 357/49 |
| 4,333,965 | 6/1982 | Chow et al. | 427/93 |
| 4,384,301 | 5/1983 | Tasch, Jr. et al. | 367/23 |
| 4,487,639 | 12/1984 | Lam et al. | 357/50 |
| 4,522,682 | 6/1985 | Soclof | 156/647 |
| 4,523,213 | 6/1985 | Konaka et al. | 357/23.7 |
| 4,532,700 | 8/1985 | Kinney et al. | 29/576 W |
| 4,533,431 | 8/1985 | Dargent | 156/643 |
| 4,536,782 | 8/1985 | Brown | 357/23.11 |
| 4,571,606 | 2/1986 | Benjamin et al. | 357/23.8 |
| 4,621,276 | 11/1986 | Malhi | 357/49 |

FOREIGN PATENT DOCUMENTS

| | | | |
|---|---|---|---|
| 42552 | 12/1981 | European Pat. Off. | 357/23.1 |
| 58-106868 | 6/1983 | Japan | 357/42 |
| 59-103381 | 6/1984 | Japan | 357/23.8 |

OTHER PUBLICATIONS

Anantha et al, "Integrated Circuits . . . Devices" *IBM TDB* vol. 16, No. 10, Mar. 74, pp. 3245.
"A Bird's Beak Free Local Oxidation Technology Feasible for VSLI Circuits Fabrication," Kuang Yi Chiu et al, IEEE Transaction on Electron Devices, v ED-29, no Apr. 1982, pp. 536–540.
"Alternatives to LOCOS Could Aid Isolation Technology," Semiconductor International L19, Mar. 1984.
"Selective Low-Pressure Silicon Epitaxy for MOS and Bipolar Transistor Application," Hans Kurter et al, IEEE Transactions on Electron Devices, v ED-30, No. 11, Nov. 1983, pp. 1511–1515.
"The Sloped-Wall SWAMI-A Defect-Free Zero Bird's Beak Local Oxidation Process for Scaled VLSI Technology," Kuang Y. Chiu et al., IEEE Transactions on Electron Devices, vol. ED-30, No. 11, Nov. 1983, pp. 1506–1511.
"Development of the Self-Aligned Titanium Silicide Process for VLSI Application," Michael E. Alperin et al., IEEE Journal of Solid-State Circuits, vol. SC-20, No. 1, Feb. 1985, pp. 61–65.

*Primary Examiner*—Andrew J. James
*Assistant Examiner*—Jerome Jackson, Jr.
*Attorney, Agent, or Firm*—Robert J. Wallace

[57] ABSTRACT

A high temperature logic field effect transistor. By surrounding the source and drain pn junctions with electrically insulative material, except where a channel runs between the source and drain, a logic field effect transistor whose on/off current ratio can still have a high value at high temperatures. The transistor can be of any standard MOS technology, such as pMOS, nMOS, or CMOS.

7 Claims, 2 Drawing Sheets

TRANSISTOR STRUCTURE FOR HIGH TEMPERATURE LOGIC CIRCUITS WITH INSULATION AROUND SOURCE AND DRAIN REGIONS

FIELD OF THE INVENTION

The present invention relates to a logic transistor structure and, more particularly, to a logic transistor having a high on/off current ratio at high temperatures.

BACKGROUND OF THE INVENTION

Field effect transistors (FETs) are commonly used to form the logic elements in digital circuits. The usefulness of the FETs in these logic circuits depends strongly on the FETs' "on/off" current ratio. Because it is easier to achieve a large value of on/off current ratio by making the magnitude of the "off" current smaller, the "off" current is very important, especially when the FET is used to control the transmission of signals throughout the logic circuit. The reason is that the "off" (or leakage) current generated at the source-to-substrate and drain-to-substrate junction will cause the electrical charge stored at a transmission gate to leak away, eventually completely draining the charge from the gate.

Among the factors affecting the on/off current ratio are the junction areas, the junction temperatures, and the geometric dimensions of the transistor channel region. The leakage current from each junction is directly proportional to the junction area. The leakage current from a junction also increases exponentially with junction temperature. Both of these factors affect the "off" contribution to the on/off ratio. The magnitude of the "on" current is a function of the geometry dimension of the gate, gate insulator thickness and the substrate doping concentration. The junction areas of the source-to-substrate and drain-to-substrate do not control the magnitude of the "on" current. Thus, for a fixed channel size, the on/off ratio can be kept at an acceptably high value by reducing the junction area without affecting the parts of the junction areas that connect to the channels. The reduction of the junction area will increase the magnitude of the on/off ratio.

In addition to these problems, "latch-up" occurs in conventional complementary metal oxide semiconductor (CMOS) structures when noise or a current surge in the circuitry causes current injection from the pn junctions into the substrate. These substrate currents forward bias the junctions of nearby transistors and cause increased carrier injection into the substrate. This positive feedback phenomenon draws large currents from the power supply and causes the CMOS circuitry to become disabled. By shielding most of the junction areas of the CMOS circuitry, thereby minimizing the area through which junction currents can be injected into the substrate, the CMOS latch-up problem can be greatly diminished.

Accordingly, to have a logic FET structure with low "off" current at high temperatures and to reduce the vulnerability of CMOS circuit latch-up, it is desirable to reduce the active junction area of the FET without affecting the situation at the channel region.

SUMMARY OF THE INVENTION

The present invention provides a FET structure having reduced junction areas and, as a result, the value of the on/off ratio can be kept acceptably high even at high temperatures. In other words, the circuits built from these FETs are still able to differentiate the two logic states "1" and "0" at high temperatures.

In general, this transistor structure is provided by forming an electrically insulative layer around each of the source and drain pn junctions without affecting that part of the junction area adjacent the transistor channel. By covering all parts of the pn junction areas except those parts immediately adjacent the channel, the junction area has been effectively reduced, thereby diminishing the leakage current without affecting the magnitude of the channel current. The resulting FET has an improved on/off ratio and allows the FETs to be operated at higher temperatures than the prior art.

In one embodiment, the FET device comprises a semiconductor substrate of a first conductivity type, having a surface, a source region of a second conductivity type formed in the substrate and adjacent the substrate surface, the source region having a surface in the substrate. The FET device further comprises a drain region, spaced apart from the source region and being of the second conductivity type, the drain region formed in the substrate and adjacent the substrate surface, the drain region having a surface disposed in the substrate, and a channel region adjacent the substrate surface and disposed between the closest portions of the respective surfaces of the source and drain regions. Source and drain region insulating layers respectively contact the surfaces of the source and drain regions disposed away from the channel region and an electronic gate on the substrate surface adjacent the channel region affects the electric field in the channel region.

In another embodiment, the drain and source regions each comprise bottom and side surfaces. The bottom surfaces can be planar and the closest portion of the side surfaces of the source and drain regions can be planar or curved. The side surfaces can be perpendicular to the substrate surface in the vicinity of the channel region. In addition, the second conductivity type can be opposite to the first conductivity type. The transistor can have any MOS transistor structure, including nMOS, pMOS, and CMOS structures.

DETAILED DESCRIPTION OF THE PREFERRED EMBODIMENT

Figure 1:
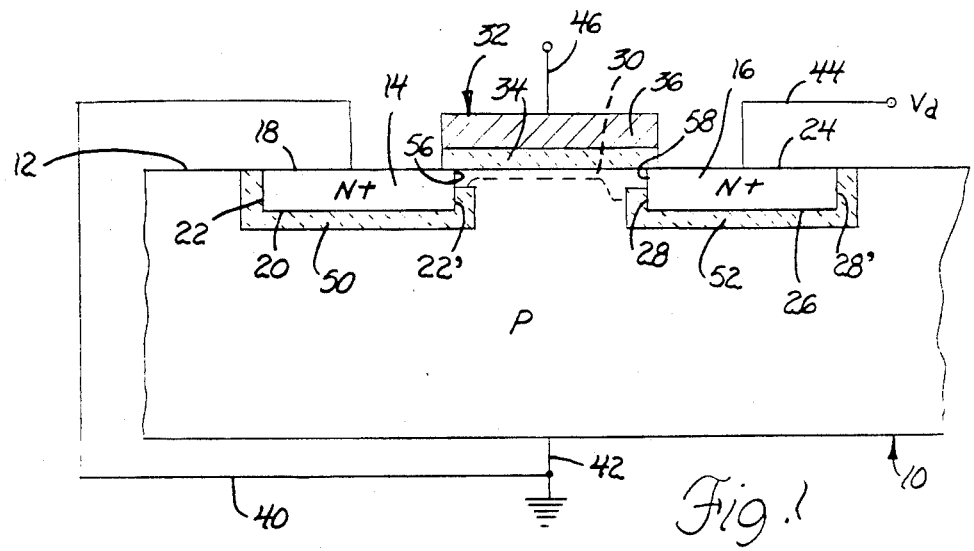
FIG. 1 of the drawings is a simplified cross-sectional view of a single field effect transistor having the structure of the present invention.

Referring now to the figures of the drawings, particularly FIG. 1, one skilled in the art will appreciate that the field effect transistor (FET) structure shown is formed on a substrate 10, such as a monocrystalline silicon substrate. Substrate 10 has a surface 12 and source and drain pn regions 14 and 16, respectively, formed therein. Source and drain regions 14 and 16 are made from semiconductor materials having different conductivity than the material of substrate 10.

Source region 14 is bounded by surface 18, which is coincident with substrate surface 12, bottom surface 20, contained within substrate 10, and side surfaces 22 and 22′ which connect surface 18 and bottom surface 20. Drain region 16 is similarly bounded by surfaces 24, 26, 28, and 28′. In other embodiments, the drain and source regions can be defined by a single side and bottom surface, such as a hemispheric surface. A channel 30, lying very close to surface 12 of substrate 10 and contained within a depth substantially smaller than the separation of bottom surfaces 20 and 26 from substrate surface 12, is formed between the closest side walls 22′ and 28 of source and drain regions 14 and 16, respectively. Electronic gate 32 comprising gate insulator 34, which may be made from silicon dioxide ($SiO_2$), and electrode 36, made from electrically conductive materials such as polycrystalline silicon or a metal placed over insulating layer 34, is formed over channel 30 on substrate surface 12.

When the structure of FIG. 1 is electrically connected as shown, i.e., with source region 14 and the bulk of substrate 10 both connected to ground, through conductors 40 and 42, and with drain region 16 connected to drain voltage $V_d$ through conductor 44, applying a positive voltage to electronic gate 32 via conductor 46 will create electric fields in channel 30. When the fields are large enough, an electrical conducting path very close to surface 12 can be induced between the source and drain terminals and cause current to flow through channel 30. When the voltage is removed from electronic gate 32, the channel current ceases flowing.

Source and drain insulative barriers 50 and 52, respectively, e.g. made from $SiO_2$, surround all sides of source and drain regions 14 and 16, respectively, except substrate surface 12 and those small portions 56 and 58 of side walls 22′ and 28, respectively, which define the ends of channel 30. Areas 56 and 58 are made small enough to drastically reduce the leakage currents between regions 14 and 16 in substrate 10, while not affecting the magnitude of the channel current passing through channel 30. This channel thickness may typically be on the order of 100 angstroms.

By virtually surrounding source and drain regions 14 and 16 by insulative layers 50 and 52, significantly diminished leakage currents are experienced. In addition, because there is very little pn junction area between regions 14 and 16 and substrate 10 has been virtually eliminated, the magnitude of the leakage current is greatly reduced. The "on" performance of the MOS transistor of FIG. 1, however, is not affected because insulative layers 50 and 52 do not interfere with the channel 30 between source and drain regions 14 and 16.

Figure 2:
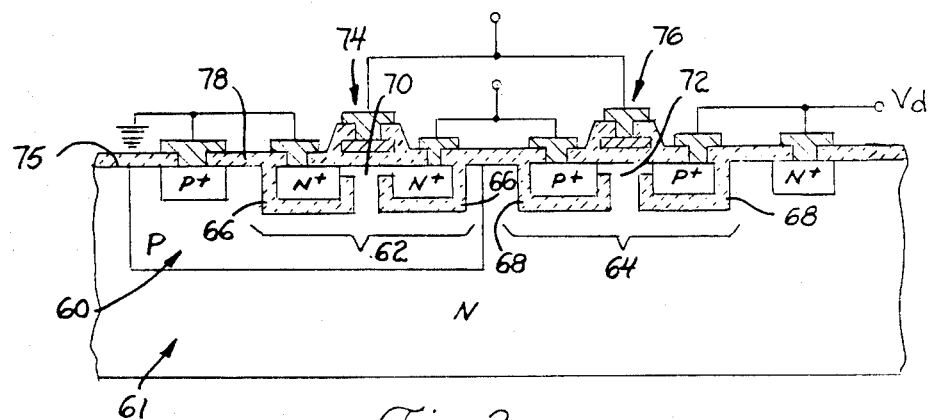
FIG. 2 of the drawings is a cross-sectional view of a CMOS field effect transistor made in accordance with the structure of the present invention.

FIG. 2 of the drawings shows a p-tub complementary metal oxide semiconductor (CMOS) FET using the structure of the present invention. Monocrystalline substrate 61 (in this case, an n-doped silicon substrate) contains a p-tub 60, consisting of an isolated volume of p-doped material contained within substrate 61. Transistors 62 and 64 each have a pair of source and drain regions. Each region is almost completely surrounded by an electrical insulator such as silicon dioxide ($SiO_2$). The only break in insulative layers 66 and 68 occurs in channels 70 and 72 respectively. Electronic gates 74 and 76 are disposed on substrate surface layer 78, which is formed on surface 75 of substrate 61. Insulating layers 66 and 68 are subsurface layers that intersect with surface layer 78 as shown. When there is a current surge in the circuits, current can be injected into the substrate and be collected by the ohmic contact of the nearby transistor. Since most of the source and drain areas are shielded from the substrate current flow path, it is very unlikely to effectively forward bias the source or drain junctions of the nearby transistor. Therefore, the positive feedback loop is very ineffective in this structure and the possibility of having the latch-up problem will be drastically reduced. The currents in channels 70 and 72, however, are unaffected by the reduction in effective junction area. The result is a CMOS structure having substantially reduced likelihood of "latch-up."

Figure 3:
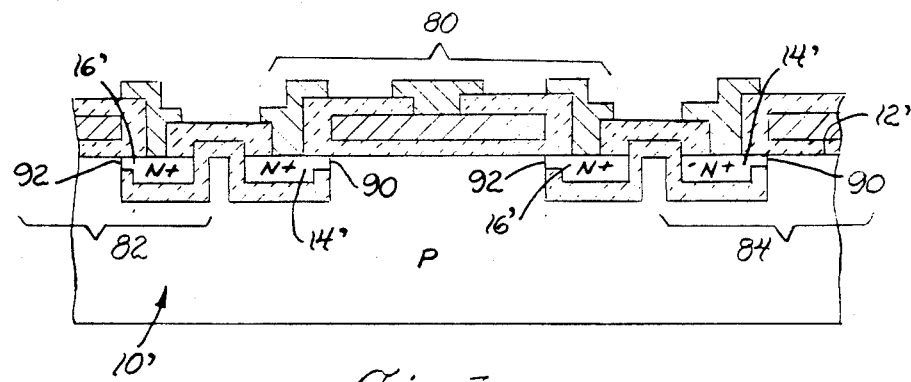
FIG. 3 of the drawings is a cross-sectional view of a portion of an integrated structure of field effect transistors, each having the structure of the present invention.

FIG. 3 of the drawings is a portion of an integrated series of MOS FET devices mad in accordance with the method of the present invention. Substrate 10′ which may be monocrystalline silicon, having an upper surface 12′, contains one complete transistor 80 and two half transistors 82 and 84, respectively. Source 14′ and drain 16′ are formed from n-doped polycrystalline silicon material, in contrast to the p-doped silicon material, comprising substrate 10′. The pn junction 90 serves as a source junction for the transistor 80, while pn junction 92 serves as the drain pn junction for the complete transistor 80 in this integrated series of transistors. It will be apparent to one skilled in the art that transistors 80, 82 and 84 can be formed simultaneously but yet operated independently. By this method, arrays of integrated MOS transistors can be created.

Figure 4A:
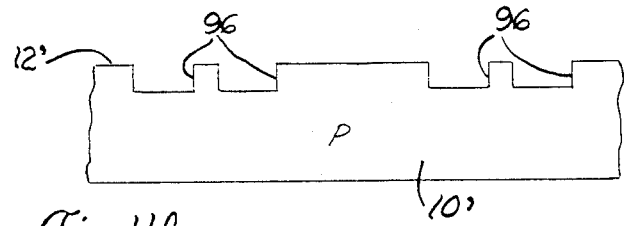
FIGS. 4A-F show manufacturing steps for producing the integrated transistor structure of FIG. 3.

FIGS. 4A–F show the processing steps used to develop the transistor structure shown in FIG. 3. As shown in FIG. 4A, the substrate 10′ of monocrystalline silicon is patterned and etched, giving rise to patterned areas 96 which form concavities in surface 12′ of substrate 10′.

Figure 4B:
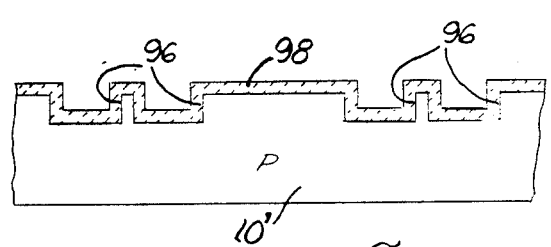
Figure 4C:
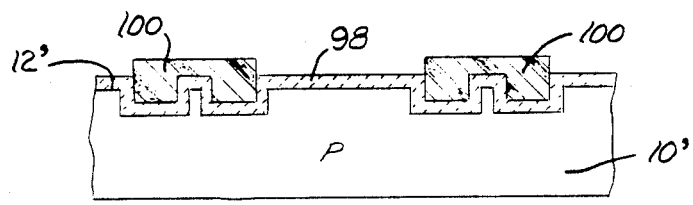
Figure 4D:
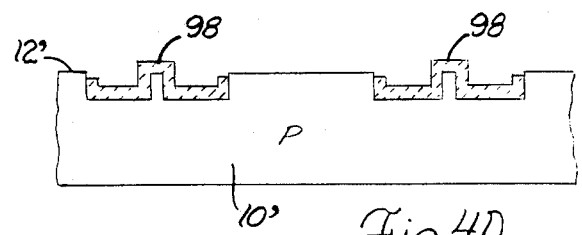

As shown in FIG. 4B, the next step is to form an insulative layer, such as $SiO_2$, over both surface 12′ and concavities 96 in substrate 10′. Following the growth of this isolation oxide 98, a masked deposition of photoresist 100 is formed in each of the concavities 96. In the next step, shown in FIG. 4D, an oxide etchant is used to remove portions of $SiO_2$ layer 98 which do not electrically insulate concavities 96. The result is that concavities 96 are insulated from substrate 10 by layer 98.

Figure 4E:
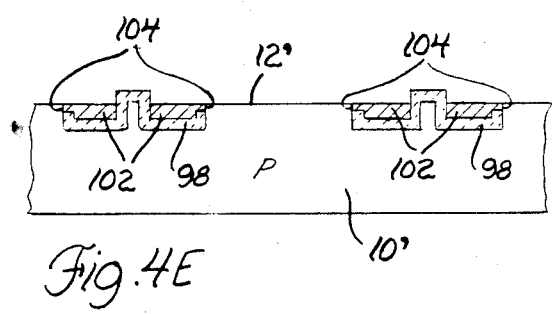

In the masking operation of FIG. 4E, concavities 96 are filled with polycrystalline silicon 102 to form the source and drain regions of a FET. By etching, regions 102 are planarized to be substantially flush with surface 12′ of substrate 10′. As can be seen from FIG. 4D, insulative layer 98 does not completely prevent polycrystalline volume 102 from contacting substrate 10′. This contact is permitted in regions 104, which will later define the ends of the channel of this MOS device.

Figure 4F:
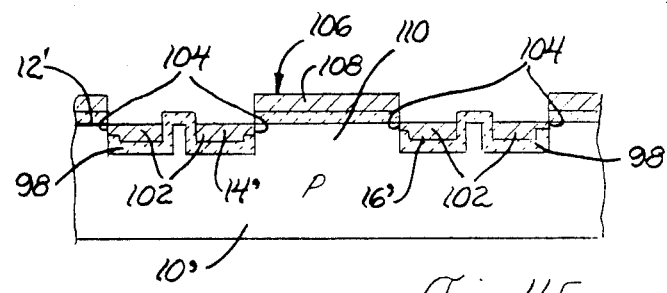

Finally, in FIG. 4F, electronic gate 106, including polycrystalline gate conductor 108, is formed in a masking operation over channel region 110. As can be seen by comparison of FIG. 4 with FIG. 3, subsequent steps well known to those skilled in the art of standard silicon gate n-channel processes will produce the final high temperature MOS FET structure of FIG. 3. Such steps include the development of insulating layers and metal contacts (not shown in FIG. 4). The metal contacts are used to make electrical connections to source 14′, gate 108 and drain 16′.

It will be apparent to those skilled in the art that various modifications to the MOS transistor structure of the present invention or the method of producing the MOS transistor structure of the present invention can be made without departing from the spirit and scope of the present invention. Accordingly, the spirit and scope of the present invention should be limited only by the following claims.

The embodiments of the invention in which an exclusive property or privilege is claimed are defined as follows:

1. A field effect transistor device, comprising:
   a homogeneous monocrystalline silicon substrate having a surface and a thickness, and being of a first conductivity type and doping concentration substantially throughout its thickness, except as hereinafter defined;
   a source region of a second conductivity type, said source region being recessed in the substrate and adjacent the substrate surface and having a surface in the substrate;
   a drain region, spaced apart from the source region and being of the second conductivity type, said drain region being recessed in the substrate and adjacent the substrate surface and having a surface in the substrate;
   a channel region in said monocrystalline substrate disposed between the closest portions of the respective surfaces of the source and drain regions within the substrate, a channel in said channel region adjacent said substrate surface and being shallow relative to the greatest spacings of said surfaces of the source and drain regions from the substrate surface;
   source and drain region insulating layers, respectively contacting substantially the entirety of those portions of the surfaces of the source and drain regions disposed in said substrate, including the majority of facing surface portions of said source and drain regions but not including those facing surface portions intersecting the channel region; and
   an electronic gate on the substrate surface adjacent the channel region for affecting the electric field in the channel region.

2. The field effect transistor device of claim 1, wherein said second conductivity type is opposite said first conductivity type.

3. A field effect transistor device comprising:
   a homogeneous monocrystalline silicon substrate having a surface and a thickness, and being of a first conductivity type and doping concentration substantially throughout its thickness, except as hereinafter defined
   a source region of a second conductivity type, said source region being recessed in the substrate adjacent the substrate surface and having a bottom surface in the substrate and one or more side surfaces disposed between said substrate surface and said bottom surface;
   a drain region, spaced apart from the source region and being of the second conductivity type, said drain region being recessed in the substrate adjacent the substrate surface and having a bottom surface in the substrate and one or more side surfaces disposed between said substrate surface and said bottom surface;
   a channel region in said monocrystalline substrate connecting the closest portions of the respective side surfaces of the source and drain regions, said channel region having an electrically conducting surface path that is shallow relative to the spacings of the bottom surfaces of the source and drain regions from the substrate surface, effective to interconnect said source and drain regions along the substrate surface but not along a plane between bottom surfaces of the source and drain regions;
   source and drain region insulating layers, respectively contacting those portions of the surfaces of the source and drain regions disposed in substrate portions away from the channel region; and
   an electronic gate on the substrate surface adjacent the channel regions for affecting the electric fields in the channel region.

4. The field effect transistor device of claim 3, wherein said second conductivity type is opposite said first conductivity type.

5. The field effect transistor device of claim 3, wherein said bottom surfaces of said source and drain regions are substantially planar.

6. The field effect transistor device of claim 3, wherein said closest portions of the respective side surfaces of the source and drain regions are substantially planar surfaces.

7. The field effect transistor device of claim 6, wherein said closest portions of the respective side surfaces of the source and drain regions are substantially parallel and perpendicular to the substrate surface in the vicinity of the channel.

* * * * *